(12) United States Patent
McGahay et al.

(10) Patent No.: US 8,232,648 B2
(45) Date of Patent: Jul. 31, 2012

(54) SEMICONDUCTOR ARTICLE HAVING A THROUGH SILICON VIA AND GUARD RING

(75) Inventors: Vincent J. McGahay, Poughkeepsie, NY (US); Michael J. Shapiro, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 136 days.

(21) Appl. No.: 12/791,398

(22) Filed: Jun. 1, 2010

(65) Prior Publication Data

US 2011/0291279 A1    Dec. 1, 2011

(51) Int. Cl.
    *H01L 23/48* (2006.01)
(52) U.S. Cl. ............... 257/758; 257/E23.145; 438/637
(58) Field of Classification Search ............... 257/758, 257/E23.145; 438/637
    See application file for complete search history.

(56) References Cited

U.S. PATENT DOCUMENTS

| | | |
|---|---|---|
| 5,347,086 A | 9/1994 | Potter et al. |
| 5,915,167 A | 6/1999 | Leedy |
| 6,133,640 A | 10/2000 | Leedy |
| 6,181,551 B1 | 1/2001 | Herman et al. |
| 6,208,545 B1 | 3/2001 | Leedy |
| 6,429,502 B1 | 8/2002 | Librizzi et al. |
| 6,547,843 B2 | 4/2003 | Shimazu et al. |
| 6,551,857 B2 | 4/2003 | Leedy |
| 6,563,224 B2 | 5/2003 | Leedy |
| 6,617,231 B1 | 9/2003 | Griffin, Jr. et al. |
| 6,632,706 B1 | 10/2003 | Leedy |
| 6,710,258 B2 | 3/2004 | Oggioni et al. |
| 6,844,263 B2 | 1/2005 | Shimazu et al. |
| 7,138,295 B2 | 11/2006 | Leedy |
| 7,138,700 B2 * | 11/2006 | Tomita et al. ............... 257/529 |
| 7,138,714 B2 | 11/2006 | Nguyen et al. |
| 7,170,144 B2 * | 1/2007 | Hsu ............... 257/499 |
| 7,193,239 B2 | 3/2007 | Leedy |
| 7,276,787 B2 | 10/2007 | Edelstein et al. |
| 7,474,004 B2 | 1/2009 | Leedy |
| 7,504,732 B2 | 3/2009 | Leedy |
| 7,516,879 B1 | 4/2009 | Buchwalter et al. |
| 7,525,186 B2 | 4/2009 | Kim et al. |
| 7,547,572 B2 | 6/2009 | Carson et al. |
| 7,633,167 B2 | 12/2009 | Kawano et al. |
| 7,705,466 B2 | 4/2010 | Leedy |
| 2002/0132465 A1 | 9/2002 | Leedy |
| 2003/0173608 A1 | 9/2003 | Leedy |
| 2009/0067210 A1 | 3/2009 | Leedy |
| 2009/0174082 A1 | 7/2009 | Leedy |

(Continued)

FOREIGN PATENT DOCUMENTS

CN    1525485    4/1998

(Continued)

*Primary Examiner* — Matthew Reames
(74) *Attorney, Agent, or Firm* — Wenjie Li; Ira D Blacker (57) ABSTRACT

Disclosed is a semiconductor article which includes a semiconductor base portion, a back end of the line (BEOL) wiring portion on the semiconductor base portion, a through silicon via and a guard ring. The semiconductor base portion is made of a semiconductor material. The BEOL wiring portion includes a plurality of wiring layers having metallic wiring and insulating material. The BEOL wiring portion does not include a semiconductor material. The through silicon via provides a conductive path through the BEOL wiring portion and the semiconductor base portion. The guard ring surrounds the through silicon via in the BEOL wiring portion.

17 Claims, 10 Drawing Sheets

| U.S. PATENT DOCUMENTS | | | FOREIGN PATENT DOCUMENTS | | |
|---|---|---|---|---|---|
| 2009/0175104 A1 | 7/2009 | Leedy | CN | 101188235 | 4/1998 |
| 2009/0218700 A1 | 9/2009 | Leedy | CN | 98803836 | 6/2004 |
| 2009/0219742 A1 | 9/2009 | Leedy | EP | 0975472 | 4/1998 |
| 2009/0219743 A1 | 9/2009 | Leedy | EP | 1986233 | 4/1998 |
| 2009/0219744 A1 | 9/2009 | Leedy | JP | 10-543031 | 4/1998 |
| 2009/0219772 A1 | 9/2009 | Leedy | JP | 2008028407 | 8/2007 |
| 2009/0230501 A1 | 9/2009 | Leedy | JP | 2008166831 | 7/2008 |
| 2010/0171224 A1 | 7/2010 | Leedy | JP | 2008166832 | 7/2008 |
| 2010/0171225 A1 | 7/2010 | Leedy | JP | 2008172254 | 7/2008 |
| 2010/0172197 A1 | 7/2010 | Leedy | KR | 10-0639752 | 10/2006 |
| 2010/0173453 A1 | 7/2010 | Leedy | KR | 10-0785821 | 12/2007 |
| 2010/0193954 A1 | 8/2010 | Liu et al. | TW | 412854 | 11/2000 |

* cited by examiner

FIG. 7

SEMICONDUCTOR ARTICLE HAVING A THROUGH SILICON VIA AND GUARD RING

BACKGROUND OF THE INVENTION

Semiconductor devices or chips (hereafter referred to as just "chips") may consist of a semiconductor base where all of the front end of the line (FEOL) processing is typically done to form the semiconductor transistors, capacitors, etc. and a back end of the line (BEOL) wiring where multiple wiring layers are formed to connect the various transistors, capacitors, etc. in the semiconductor base. The BEOL wiring may also have input/output (I/O) pads for connecting the chip to a next level of packaging such as a printed circuit board or a ceramic substrate. The semiconductor base is made from a semiconductor material while the BEOL wiring is made from metallic materials for wiring and dielectric material for insulation. The BEOL wiring does not contain semiconductor materials.

Current semiconductor chips may have a through silicon via which partially or entirely extends through the semiconductor base and the BEOL wiring. Such a through silicon via may be used, for example, to connect two chips by stacking them one on top of the other.

BRIEF SUMMARY OF THE INVENTION

The various advantages and purposes of the present invention as described above and hereafter are achieved by providing, according to a first aspect of the invention, a semiconductor article which includes a semiconductor base portion including a semiconductor material; a back end of the line (BEOL) wiring portion on the semiconductor base portion and including a plurality of wiring layers having metallic wiring and insulating material, said BEOL wiring portion excluding a semiconductor material; a through silicon via providing a conductive path through the BEOL wiring portion and the semiconductor base portion; and a guard ring surrounding the through silicon via in the BEOL wiring portion.

According to a second aspect of the invention, there is provided a method of forming a semiconductor article which includes the steps of (a) providing a semiconductor base portion including a semiconductor material; (b) forming a back end of the line (BEOL) wiring layer including a metallic material and a dielectric material and excluding a semiconductor material, the BEOL wiring layer comprising a contiguous guard ring portion; (c) repeating step (b) until a predetermined number of BEOL wiring layers have been formed into a BEOL wiring portion with each contiguous guard ring portion being formed over, and in contact with, a previous contiguous guard ring portion to form a guard ring extending through the entire BEOL wiring portion; (d) forming a through silicon via opening through the BEOL wiring portion and the semiconductor base portion, the through silicon via opening through the BEOL wiring portion being contained wholly within the guard ring; and (e) depositing metallization in the through silicon via opening.

According to a third aspect of the invention, there is provided a method of forming a semiconductor article which includes the steps of (a) forming a semiconductor base portion including a semiconductor material; (b) forming a back end of the line (BEOL) wiring portion including a plurality of layers of metallic material and a dielectric material and excluding a semiconductor material; (c) forming an opening for a guard ring at least in the BEOL wiring portion; (d) filling the guard ring opening with a material; (e) forming a through silicon via opening through the BEOL wiring portion and the semiconductor base portion, the through silicon via opening through the BEOL wiring portion being contained wholly within the guard ring opening; and (f) depositing metallization in the through silicon via opening.

BRIEF DESCRIPTION OF THE DRAWINGS

The features of the invention believed to be novel and the elements characteristic of the invention are set forth with particularity in the appended claims. The Figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

Figure 1A:
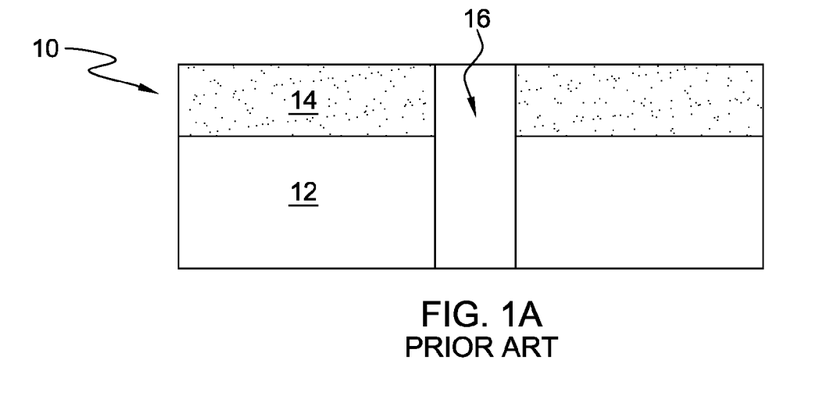
FIGS. 1A to 1C are cross sectional views illustrating a prior art method of forming a through silicon via in a semiconductor chip.
Figure 1B:
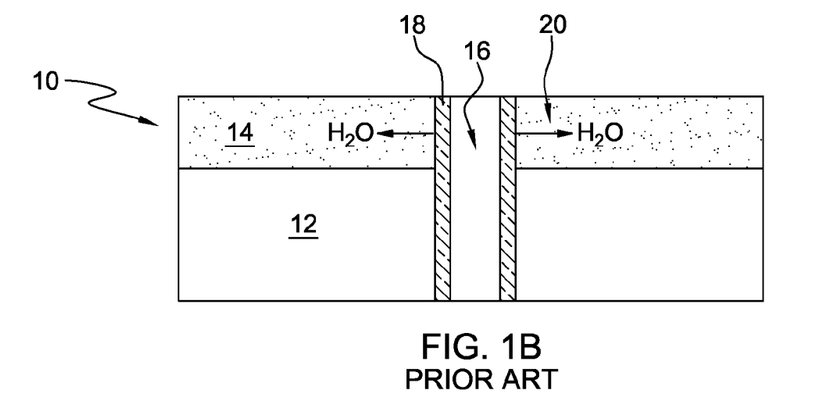
Figure 1C:
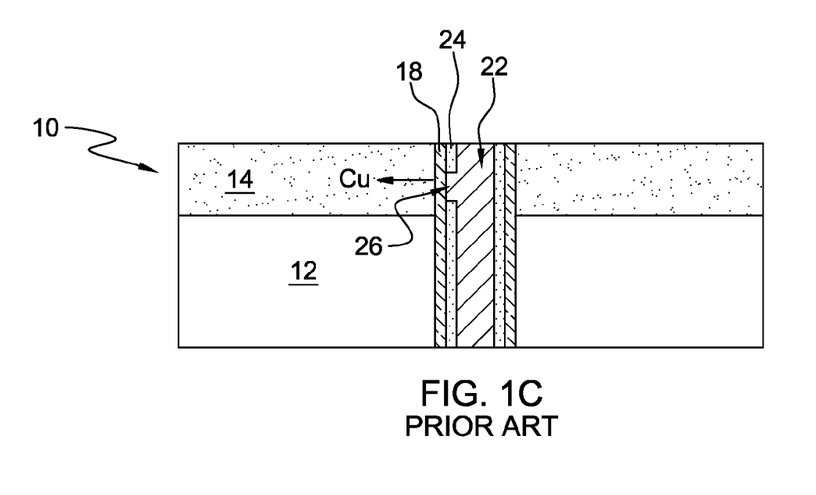

Referring to the Figures in more detail, FIGS. 1A to 1C illustrate a prior art method of forming a through silicon via. Referring first to FIG. 1A, a semiconductor chip 10 includes a semiconductor base 12 and BEOL wiring 14. It is to be understood that only a portion of semiconductor chip 10 is shown in FIGS. 1A to 1C. The semiconductor base 12 has undergone front end of the line (FEOL) processing to form the various individual devices such as transistors, capacitors and the like. Such individual devices are not shown for clarity. The BEOL wiring 14 includes multiple layers (not shown) of metallic wiring with an insulating dielectric material. The precise details of BEOL wiring 14 are well known to those skilled in the art and need not be shown here. Also shown in FIG. 1A is a through silicon via opening 16 which has been etched through the BEOL wiring 14 and semiconductor base 12.

An insulating material 18 may then be deposited on the walls of the through silicon via opening 16. In one conventional process for depositing the insulating material 18, O3/TEOS (Tetraethyl orthosilicate) is used. A byproduct of the formation of the insulating material 18 is the production of water which can migrate into the dielectric material of the BEOL wiring 14, as indicated by arrows 20 in FIG. 1B. Water can be detrimental to the insulating material of the BEOL wiring 14, particularly where the insulating material comprises a so-called low dielectric constant (low-k) material.

The through silicon via opening 16 is metallized by depositing a metallic material 22, such as copper, into the via opening 16 as shown in FIG. 1C. The via opening 16 may also include a liner layer 24, such as Ta/TaN. If there is incomplete coverage of the wall of the via opening 16 by the liner layer 24, as indicated by gap 26, diffusion of the metallization 22, particularly if it is copper, into the wiring layers of the BEOL wiring 14 may occur. Such diffusion of the metallization 22 is to be avoided.

The present invention is directed to a guard ring that surrounds a through silicon via. The guard ring performs no electrical function and is meant to perform as a barrier to moisture and metal diffusion from the through silicon via.

Figure 2A:
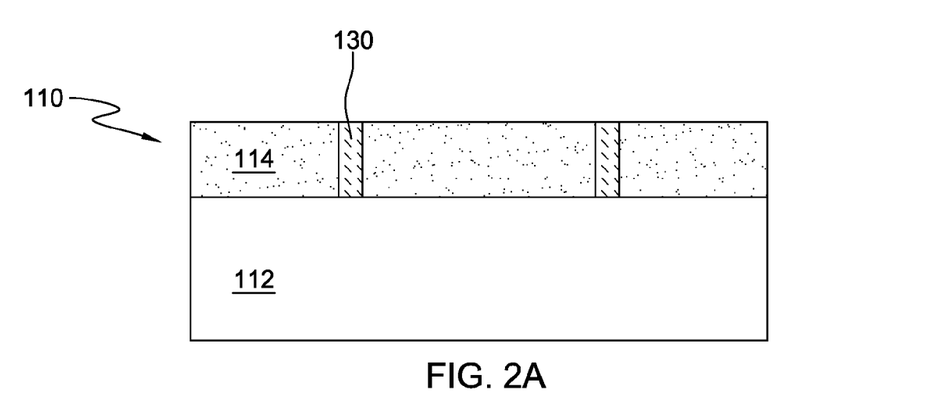
FIGS. 2A to 2D are cross sectional views illustrating a first method according to the invention of forming a through silicon via and a guard ring in a semiconductor chip and the inventive semiconductor article having the guard ring.

Referring now to FIGS. 2A to 2D, a first embodiment of the present invention is illustrated. Referring first to FIG. 2A, a semiconductor chip 110 includes a semiconductor base 112 and BEOL wiring 114. For clarity, the semiconductor base 112 is not shown in cross section. It is to be understood that only a portion of semiconductor chip 110 is shown in FIGS. 2A to 2D. Some suitable materials for semiconductor base 112 include but are not limited to group IV semiconductors such as silicon, silicon germanium or germanium, a III-V compound semiconductor, or a II-VI compound semiconductor. The metallization of the BEOL wiring 114 is usually copper but can also be aluminum in the upper layers. The insulation of BEOL wiring 114 may be any suitable material such as silicon dioxide, silicon nitride or SiCOH (a compound consisting of silicon, carbon, oxygen and hydrogen).

The semiconductor base 112 has undergone front end of the line (FEOL) processing to form the various individual devices such as transistors, capacitors and the like. Such individual devices are not shown for clarity. The BEOL wiring 114 includes multiple layers (not shown) of metallic wiring with an insulating dielectric material. The precise details of BEOL wiring 14 are well known to those skilled in the art and need not be shown here. Also shown in FIG. 2A is guard ring 130 which may be formed when the individual wiring layers of BEOL wiring 114 are formed. The formation of guard ring 130 will be discussed in more detail hereafter. In one preferred embodiment of the present invention, the guard ring 130 is a ring or fence of metallic material that encloses the area where the through silicon via will be formed. Guard ring 130 extends at least the entire vertical length of the through silicon via in the BEOL wiring 14.

Figure 2B:
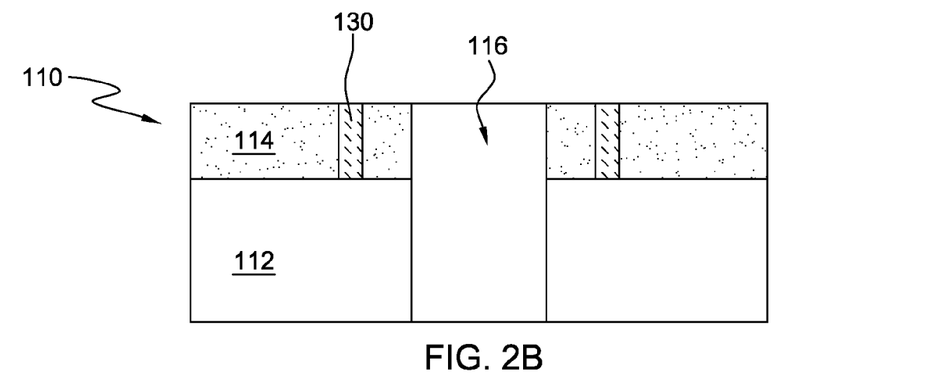
Figure 2C:
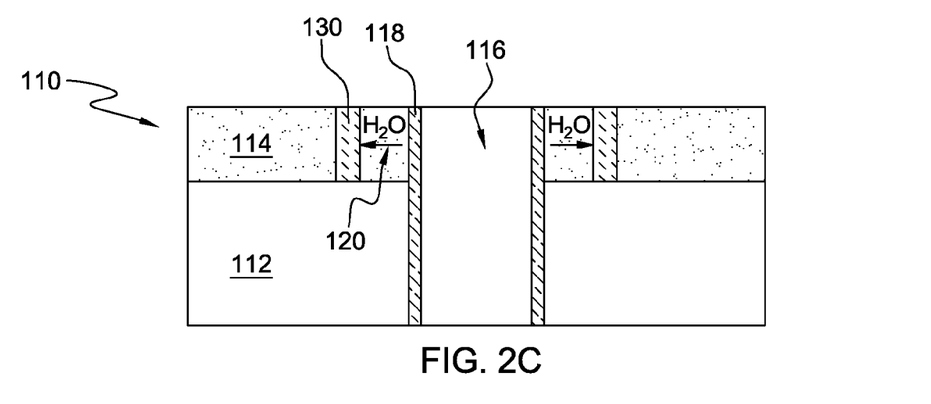

Shown in FIG. 2B is a through silicon via opening 116 which has been conventionally etched through the BEOL wiring 114 and semiconductor base 112. The location of the through silicon via opening 116 has been chosen so as to be within the guard ring 130. While through silicon via opening 116 is shown as being etched entirely though the BEOL wiring 114 and semiconductor base 112, it is within the scope of the present invention for through silicon via opening 116 to be etched only partially through the BEOL wiring 114 and/or semiconductor base 112.

An insulating material 118 may then be deposited on the walls of the through silicon via opening 116. In one conventional process for depositing the insulating material 118, O3/TEOS (Tetraethyl orthosilicate) is used. The insulating material 118 may have a thickness of about 1 μm. A byproduct of the formation of the insulating material 118 is the production of water which can migrate into the dielectric material of the BEOL wiring 114, as indicated by arrows 120 shown in FIG. 2C. As noted above, water can be detrimental to the insulating material of the BEOL wiring 114, particularly where the insulating material comprises a so-called low dielectric constant (low-k) material. However, the guard ring 130 blocks any water that may be present from entering the insulating material of the BEOL wiring 114. The small volume of insulating material between the through silicon via opening 116 and guard ring 130 may be essentially nonfunctional so the presence of water here is not detrimental to the semiconductor chip 110.

Figure 2D:
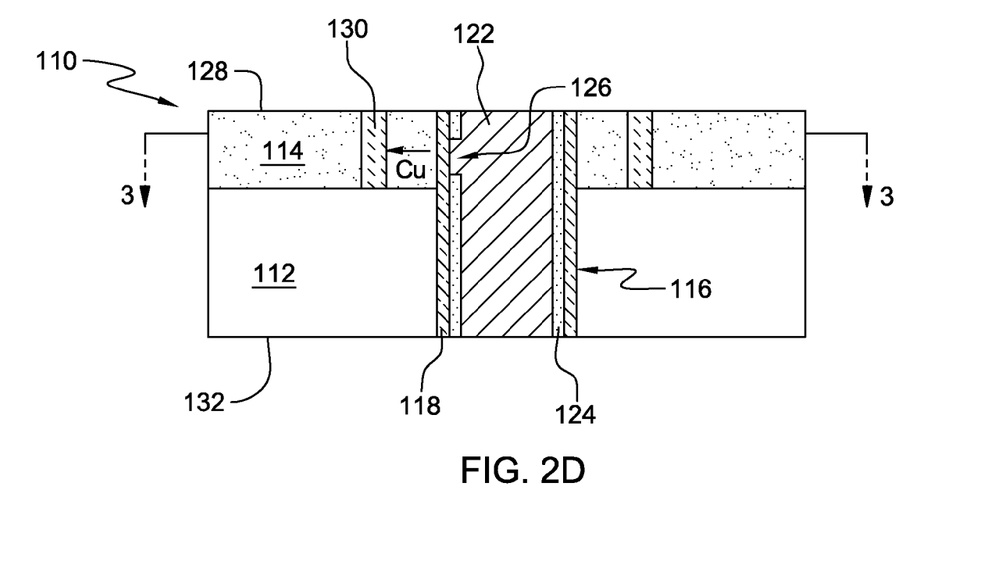

Next, the through silicon via opening 116 is metallized by conventionally depositing a metallic material 122, such as copper, into the through silicon via opening 116 as shown in FIG. 2D. The through silicon via opening 116 may also include a conventional liner layer 124, such as Ta/TaN. The liner layer may have a thickness of about 10 nm-100 nm. If there is incomplete coverage of the wall of the through silicon via opening 116 by the liner layer 124, as indicated by gap 126, this may allow for diffusion of the metallization 122, particularly if it is copper, into the wiring layers of the BEOL wiring 114. However, the presence of guard ring 130 prevents the metallization 122 from entering the functional portion of the wiring layers of the BEOL wiring 114. In another embodiment of the present invention, the liner layer 124 may be dispensed with since any migration of the metallization 122 into the functional portion of the BEOL wiring 114 would be prevented by the guard ring 130.

The metallized through silicon via 116, as shown in FIG. 2D, may extend through all of the BEOL wiring 114 and the semiconductor base 112. In other embodiments of the present invention, the metallized through silicon via 116 may extend only partially through the BEOL wiring 114 and/or the semiconductor base 112.

It is to be noted that the metallized through silicon via 116 may extend continuously through the BEOL wiring 114 and semiconductor base 112. By "continuously", it is meant that the metallized through silicon via 116 extends through the semiconductor chip 110 from or near surface 128 of the BEOL wiring 114 to or near surface 132 of the semiconductor base 112 in a straight path without any jogs to the side.

Figure 3A:
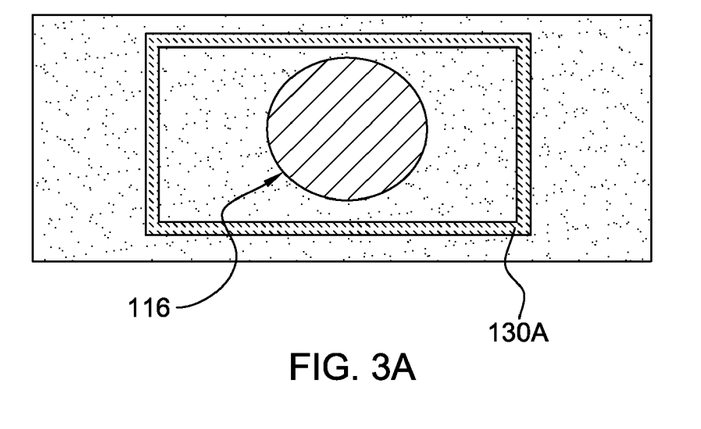
FIGS. 3A to 3C are cross sectional views in the direction of arrows 3-3 in FIG. 2D illustrating various embodiments of the guard ring according to the present invention.
Figure 3B:
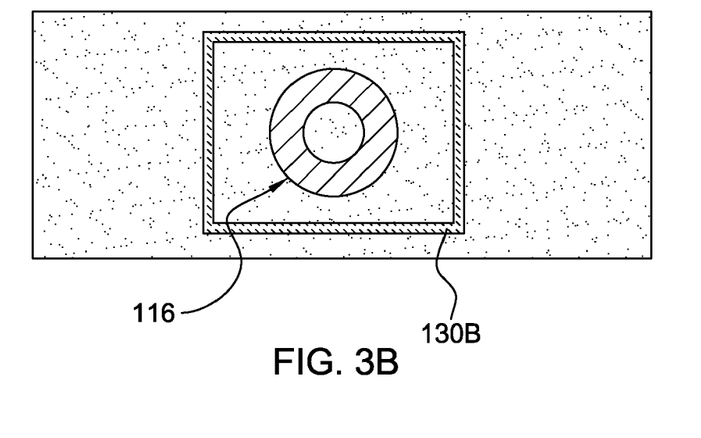
Figure 3C:
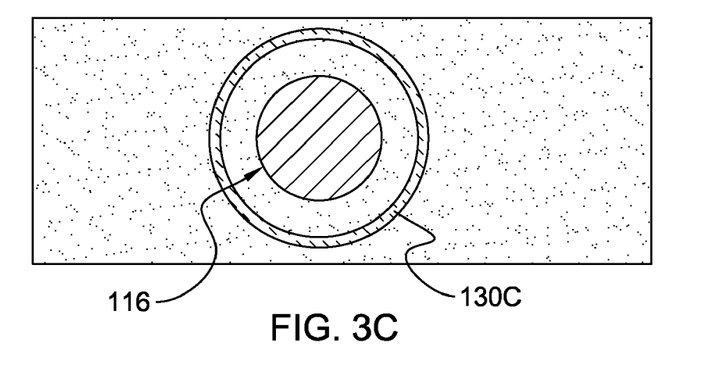
Figure 4:
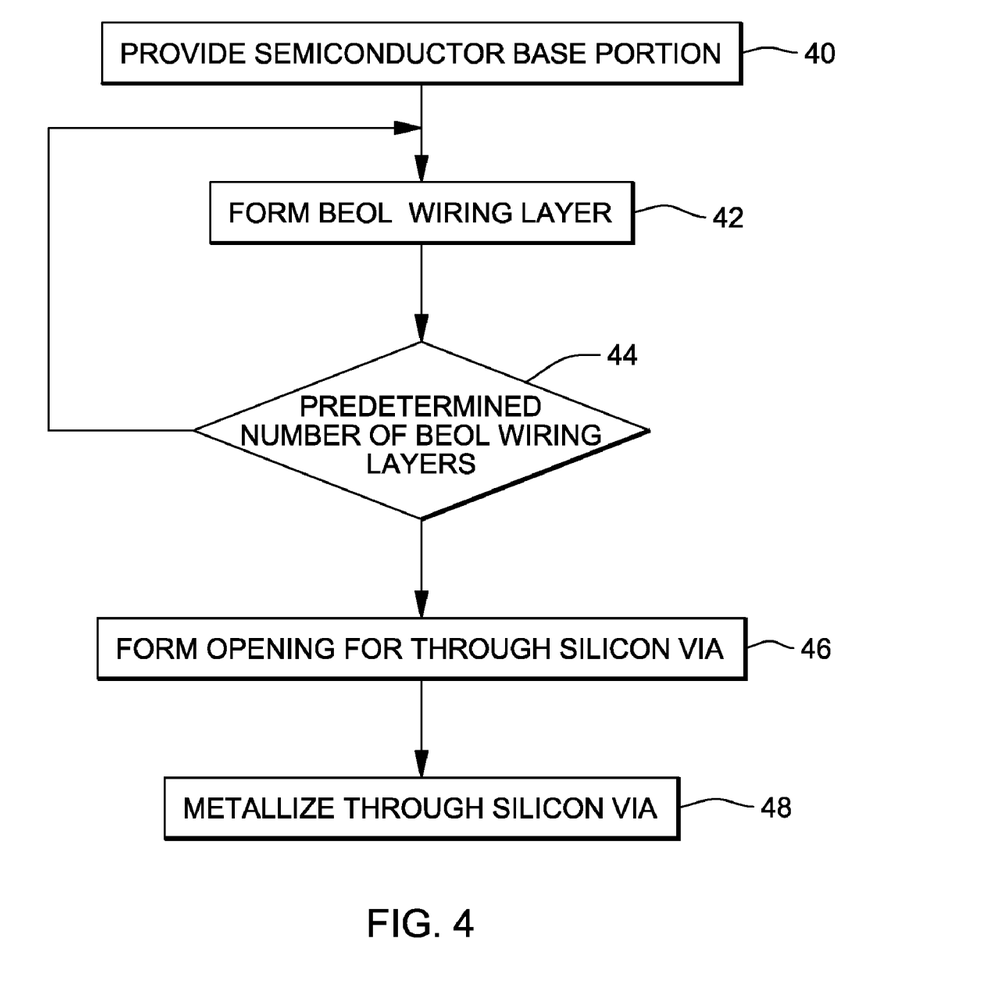
FIG. 4 is a flow chart illustrating the first method according to the present invention.

The guard ring 130 may be formed in different shapes to fit the needs of the semiconductor design. FIGS. 3A to 3C are cross sections of the semiconductor chip 110 in the direction of arrows 3-3 of FIG. 2D. Referring first to FIG. 3A, it can be seen that guard ring 130A is rectangular in cross section. In FIG. 3B, guard ring 130B is square in cross section while in FIG. 3C, guard ring 130C is circular in cross section. Metallized through silicon via 116 may be solid as shown in FIGS. 3A and 3C or may be hollow in the center as shown in FIG. 3B. FIGS. 3A to 3C are only examples of guard ring cross sections and are not meant to be limiting. The individual layers of metallized through silicon via 116 are not shown for clarity.

The dimensions of the guard ring 130 and metallized through silicon via 116 will vary depending on the design requirements of the semiconductor chip. In an example of one embodiment, for purposes of illustration and not limitation, the metallized through silicon vias 116 may have an outside diameter of about 17 micro-meters (μm), the guard ring 130 (FIG. 3B) may have an outside dimension of 20 μm by 20 μm, and the guard ring 130 has a thickness of about 1 μm.

Figure 5A:
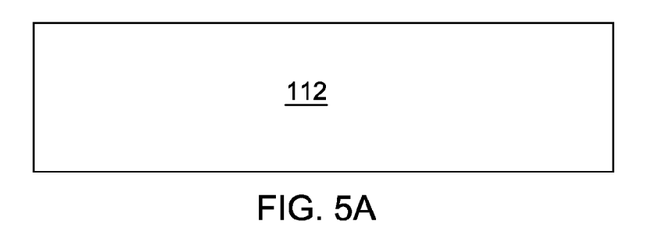
FIGS. 5A to 5E are cross sectional views illustrating formation of the guard ring according to a first embodiment of the present invention.
Figure 5B:
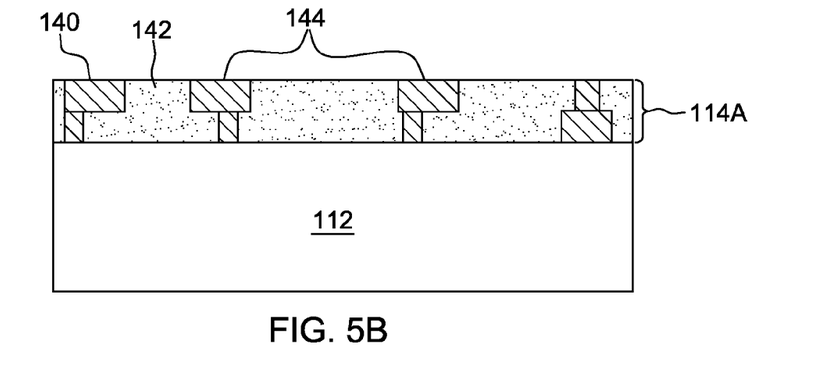
Figure 5C:
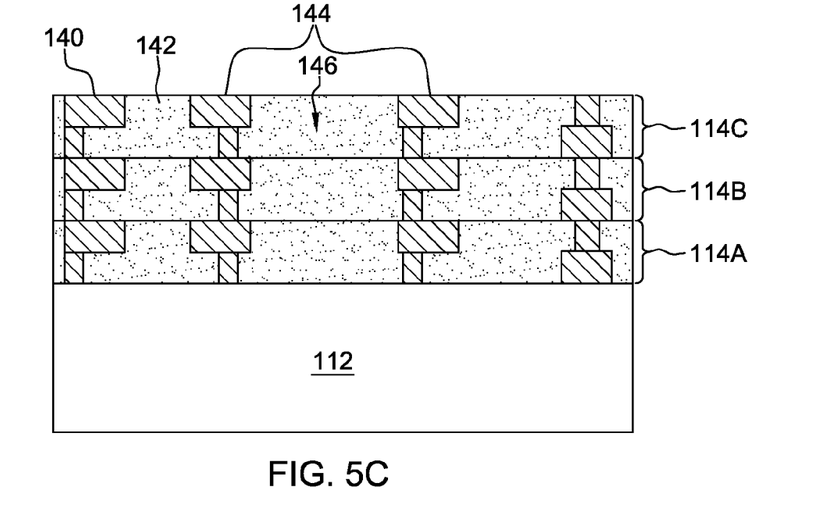
Figure 5D:
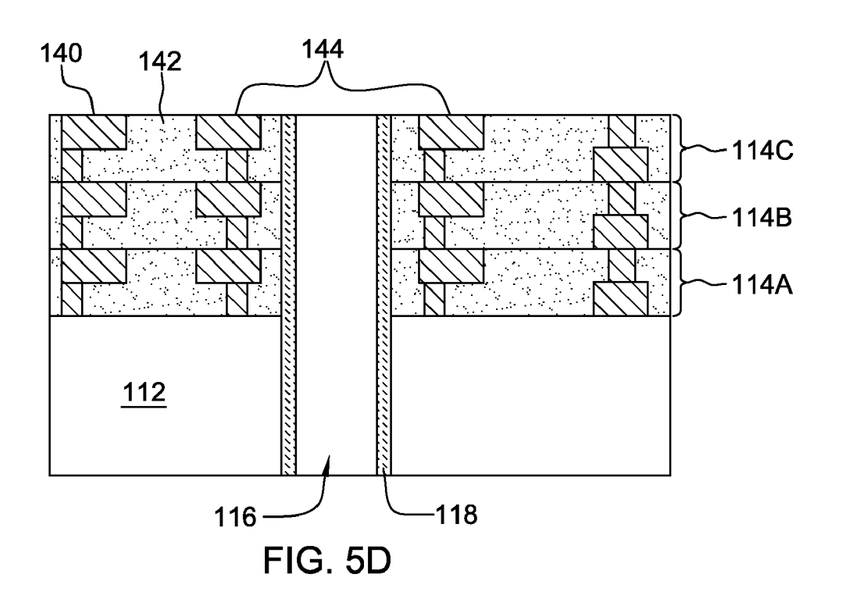
Figure 5E:
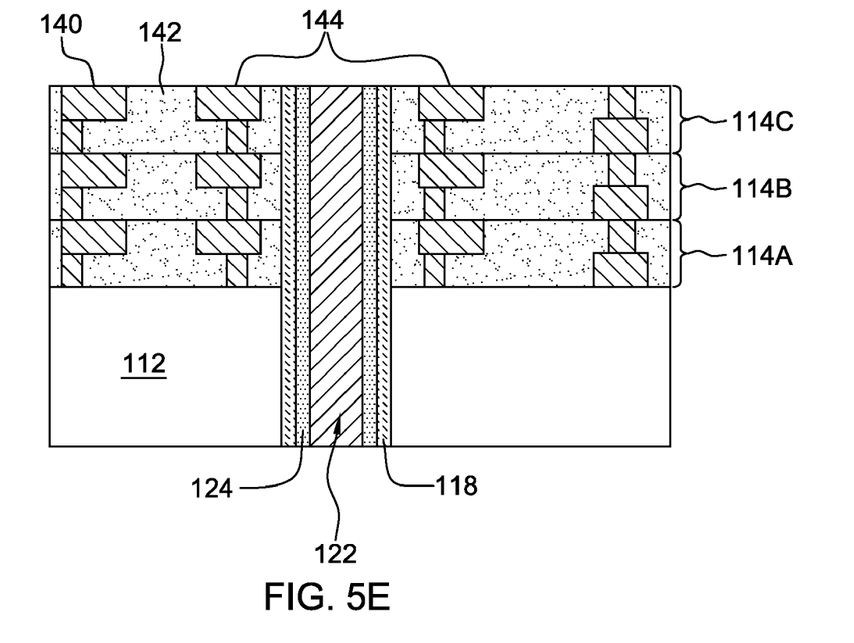

The method of forming a semiconductor article having a through silicon via and a guard ring will be next described with reference to FIG. 4 and FIGS. 5A to 5E. In a first step of the method, a semiconductor base 112 is provided, box 40 in FIG. 4 and FIG. 5A. That is, a semiconductor wafer is prepared with all of the necessary semiconductor devices such as transistors, capacitors and the like. It should be understood that only a portion of the semiconductor wafer is shown in FIG. 5A. Next a first BEOL wiring layer 114A is formed including metallization 140 and dielectric material 142 as indicated in box 42 and FIG. 5B. It is noted that BEOL wiring layer 114A contains a guard ring portion 144 which will perform no electrical function in the BEOL wiring 114. The formation of BEOL wiring layer 114A and all subsequent BEOL wiring layers are by conventional methods. Additional BEOL wiring layers are formed until a predetermined number of BEOL wiring layers are formed to meet the design requirements of the semiconductor chip, box 44 in FIG. 4 and FIG. 5C. As shown in FIG. 5C, there are only two additional BEOL wiring layers formed, 114B and 114C, but in practice there will usually be more such BEOL wiring layers formed. It is to be noted that the guard ring portions 144 of each BEOL wiring layer are stacked on top of the guard ring portion 144 of the preceding BEOL wiring layer. The various guard ring portions 144 form, for example, a square, rectangular, circular or other shape, as discussed above. Within the guard ring portions 144 is an open area 146 where the through silicon via 116 will be formed. As indicated in box 46 of FIG. 4 and FIG. 5D, the through silicon via 116 is formed in the open area 146 (and within guard ring portions 144) and an insulating layer 118 is formed by conventional means. Lastly, the through silicon via 116 is metallized with an optional liner layer 124 and metallization 122, box 48 of FIG. 4 and FIG. 5E. Semiconductor processing then proceeds in a conventional way.

Figure 6A:
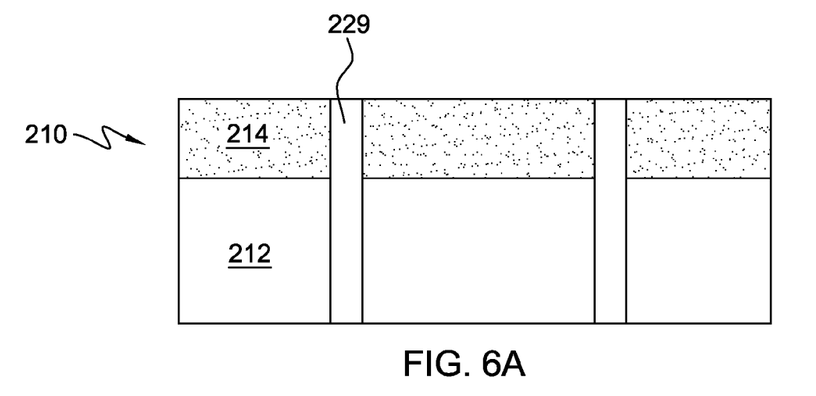
FIGS. 6A to 6E are cross sectional views illustrating a second method according to the invention of forming a through silicon via and a guard ring in a semiconductor chip and the inventive semiconductor article having the guard ring.

Referring now to FIGS. 6A to 6E, a second embodiment of the present invention is illustrated. Referring first to FIG. 6A, a semiconductor chip 210 includes a semiconductor base 212 and BEOL wiring 214. For clarity, the semiconductor base 212 is not shown in cross section. Semiconductor base 212 and BEOL wiring 214 are substantially the same as semiconductor base 112 and BEOL wiring 114 discussed with respect to FIGS. 2A to 2D.

Also shown in FIG. 6A is opening 229 for the formation of a guard ring 230. The opening 229 preferably extends only through BEOL wiring 214 but may also extend into and through semiconductor base 212 as shown in FIG. 6A. The opening 229 may be formed by conventional etching through BEOL wiring 214 and semiconductor base 212. Since opening 229 will enclose or surround a through silicon via, the opening 229 will have a polygonal shape, for example, circular, square or rectangular, such as to be able to enclose the through silicon via. In this second embodiment of the present invention, the opening 229 may be filled with a metallic material or nonmetallic material, as will be discussed hereafter. In one preferred embodiment of the present invention, guard ring 230 is a ring or fence of metallic material that encloses the area where the through silicon via will be formed. Guard ring 230 extends at least the entire vertical length of the through silicon via in the BEOL wiring 14.

Figure 6B:
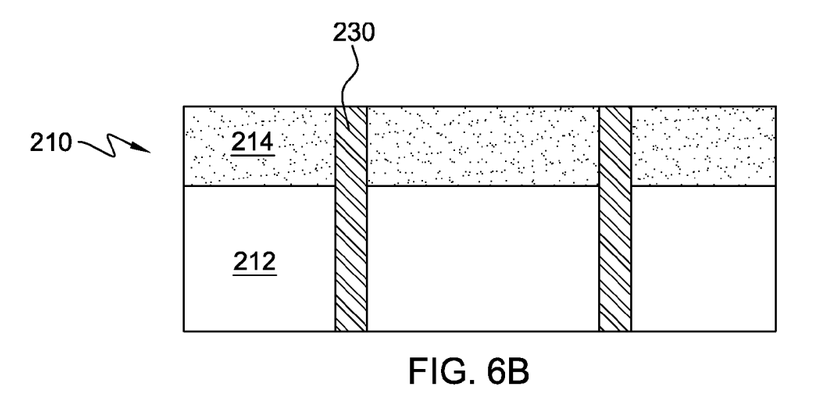

Referring now to FIG. 6B, opening 229 has been conventionally filled with a metallic or nonmetallic material to form guard ring 230. If a metallic material (e.g., aluminum or copper with a barrier material) is used, the opening 229/guard ring 230 should be limited to the BEOL wiring 214 only. When opening 229 is filled with a metallic material, guard ring 230 is a ring or fence of metallic material that encloses the area where the through silicon via will be located and extends the entire vertical length of the through silicon via in the BEOL wiring 214. It should be understood that the previously discussed embodiment is the preferred methodology for a metallic guard ring.

In a preferred embodiment of the present invention, opening 229 is filled with a nonmetallic material such as silicon nitride. When opening 229 is filled with a nonmetallic material, guard ring 230 is a ring or fence of nonmetallic material that encloses the area where the through silicon via will be located and may extend the entire vertical length of the through silicon via in the BEOL wiring 214 and semiconductor base 212. In a further preferred embodiment, the nonmetallic guard ring 230 is limited to BEOL wiring 214.

Figure 6C:
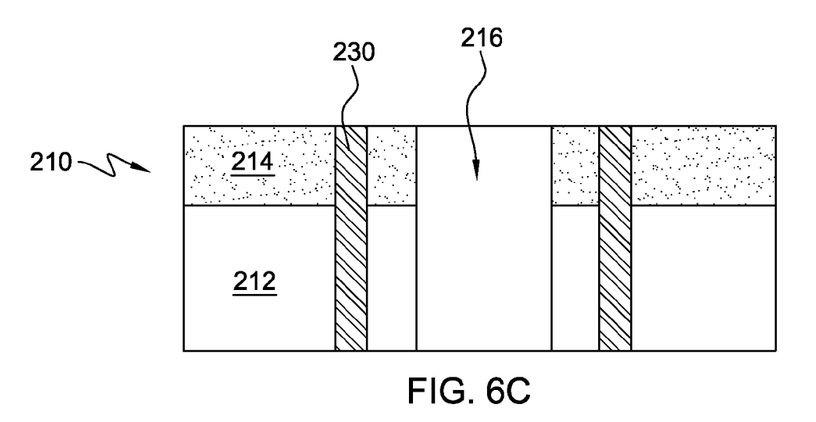
Figure 6D:
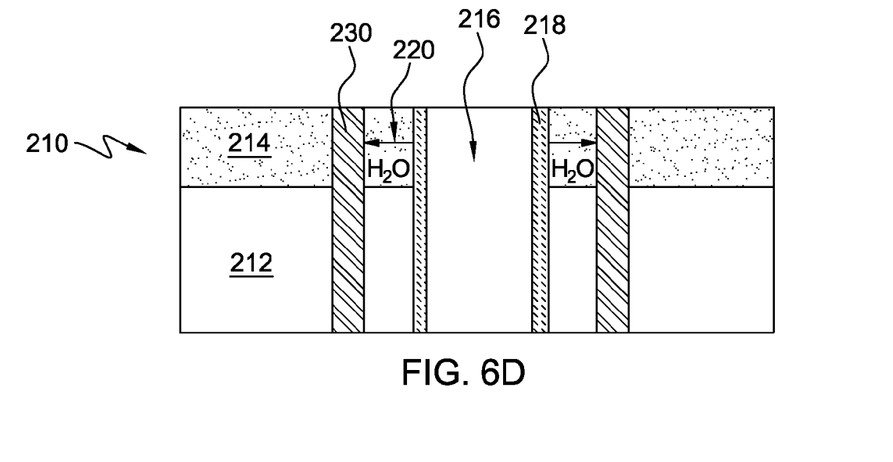

Shown in FIG. 6C is a through silicon via opening 216 which has been conventionally etched through the BEOL wiring 214 and semiconductor base 212. The location of the through silicon via opening 216 has been chosen so as to be within the area enclosed by the guard ring 230. Guard ring 230 may be formed prior to forming silicon via opening 216 as shown in FIGS. 6B and 6C. While through silicon via opening 216 is shown as being etched entirely though the BEOL wiring 214 and semiconductor base 212, it is within the scope of the present invention for through silicon via opening 216 to be etched only partially through the BEOL wiring 214 and/or semiconductor base 212.

An insulating material 218 may then be deposited on the walls of the through silicon via opening 216. In one conventional process for depositing the insulating material 218, O3/TEOS (Tetraethyl orthosilicate) is used. The insulating material 218 may have a thickness of about 1 μm. A byproduct of the formation of the insulating material 218, as discussed above, is the production of water which can migrate into the dielectric material of the BEOL wiring 214, as indicated by arrows 220 shown in FIG. 6D. The guard ring 230 blocks any water that may be present from entering the insulating material of the BEOL wiring 214 and the semiconductor base 212 if the guard ring 230 extends into the semiconductor base 212.

Figure 6E:
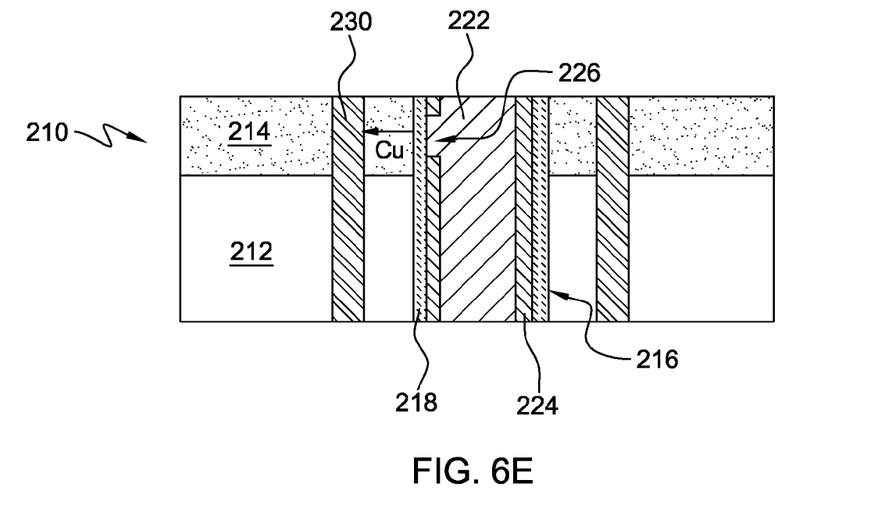

Next, the through silicon via opening 216 is metallized by conventionally depositing a metallic material 222, such as copper, into the through silicon via opening 216 as shown in FIG. 6E. The through silicon via opening 216 may also include a conventional liner layer 224, such as Ta/TaN which may have a thickness of about 10 nm-100 nm. If there is incomplete coverage of the wall of the through silicon via opening 216 by the liner layer 224, as indicated by gap 226, diffusion of the metallization 222, particularly if it is copper, into the wiring layers of the BEOL wiring 214 may occur. However, the presence of guard ring 230 prevents the metallization 222 from entering the functional portion of the wiring layers of the BEOL wiring 214. In another embodiment of the present invention, the liner layer 224 may be dispensed with since any migration of the metallization 222 into the functional portion of the BEOL wiring 214 would be prevented by the guard ring 230.

The metallized through silicon via 216, as shown in FIG. 6E, may extend through all of the BEOL wiring 214 and the semiconductor base 212. In other embodiments of the present invention, the metallized through silicon via 216 may extend only partially through the BEOL wiring 214 and/or the semiconductor base 212.

It is to be noted that the metallized through silicon via 216 extends continuously (as defined previously) through the BEOL wiring 214 and/or semiconductor base 212.

Figure 7:
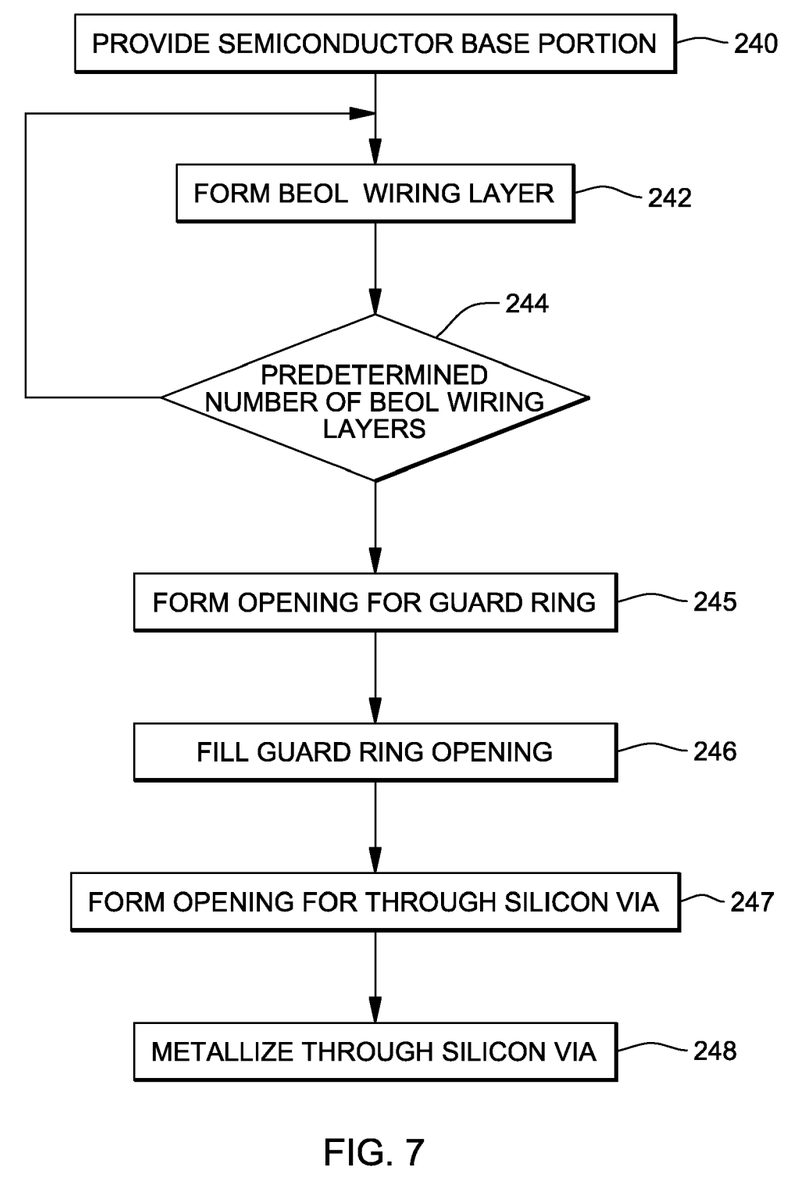
FIG. 7 is a flow chart illustrating the second method according to the present invention.

A second method of forming a semiconductor article having a through silicon via and a guard ring will be next described with reference to FIG. 7. In a first step of the method, a semiconductor base 212 is provided, box 240 in FIG. 7. That is, a semiconductor wafer is prepared with all of the necessary semiconductor devices such as transistors, capacitors and the like. Next a first BEOL wiring layer is conventionally formed including metallization and dielectric material as indicated in box 242. Additional BEOL wiring layers are formed until a predetermined number of BEOL wiring layers are formed to meet the design requirements of the semiconductor chip, box 244. Next, an opening for the guard ring is formed, box 245. This opening may be limited to the BEOL wiring (preferred) or may continue into the semiconductor base. The opening for the guard ring is then filled with a nonmetallic or metallic material as described previously, box 246. As indicated in box 247, an opening for the through silicon via is formed in the semiconductor chip and within the opening for the guard ring. Lastly, the through silicon via is metallized with an optional liner layer and metallization, box 248. Semiconductor processing then proceeds in a conventional way.

It will be apparent to those skilled in the art having regard to this disclosure that other modifications of this invention beyond those embodiments specifically described here may be made without departing from the spirit of the invention. Accordingly, such modifications are considered within the scope of the invention as limited solely by the appended claims.

We claim:

1. A semiconductor article comprising:
   a semiconductor base portion comprising a semiconductor material;
   a back end of the line (BEOL) wiring portion on the semiconductor base portion and comprising a plurality of wiring layers having metallic wiring and insulating material, said BEOL wiring portion excluding a semiconductor material;
   a through silicon via providing a conductive path through the BEOL wiring portion and the semiconductor base portion; and
   a guard ring surrounding the through silicon via in the BEOL wiring portion, the through silicon via through the semiconductor base portion being free of any guard ring.

2. The semiconductor article of claim 1 wherein the guard ring comprises a plurality of solid metallic portions in the BEOL wiring layers that are stacked in the BEOL wiring portion to form a metallic structure surrounding the through silicon via in the BEOL wiring portion.

3. The semiconductor article of claim 1 wherein the guard ring comprises a metallic material.

4. The semiconductor article of claim 3 wherein the metallic material is selected from the group consisting of copper, aluminum and alloys and mixtures thereof.

5. The semiconductor article of claim 1 wherein the guard ring comprises a nonmetallic material.

6. The semiconductor article of claim 1 wherein the through silicon via comprises copper.

7. The semiconductor article of claim 1 wherein the semiconductor base portion has a first surface and the BEOL wiring portion has a second surface and the through silicon via continuously extends from the first surface to the second surface.

8. The semiconductor article of claim 1 wherein the guard ring is spaced from the through silicon via in the BEOL wiring portion.

9. The semiconductor article of claim 1 wherein the guard ring is a barrier to moisture and metal diffusion.

10. The semiconductor article of claim 1 wherein the through silicon via has a length within the BEOL wiring portion and the guard ring has a length within the BEOL wiring portion such that the length of the guard ring is coextensive with the length of the through silicon via in the BEOL wiring portion.

11. A method of forming a semiconductor article comprising the steps of:
    (a) providing a semiconductor base portion comprising a semiconductor material;
    (b) forming a back end of the line (BEOL) wiring layer comprising a metallic material and a dielectric material and excluding a semiconductor material, the BEOL wiring layer comprising a contiguous guard ring portion;
    (c) repeating step (b) until a predetermined number of BEOL wiring layers have been formed into a BEOL wiring portion with each contiguous guard ring portion being formed over, and in contact with, a previous contiguous guard ring portion to form a guard ring extending through the entire BEOL wiring portion;
    (d) forming a through silicon via opening through the BEOL wiring portion and the semiconductor base portion, the through silicon via opening through the BEOL wiring portion being contained wholly within the guard ring, the through silicon via opening through the semiconductor base portion being free of any guard ring; and
    (e) depositing metallization in the through silicon via opening to form a through silicon via.

12. The method of claim 11 wherein the guard ring comprises a plurality of solid metallic guard ring portions in the BEOL wiring layers that are stacked in the BEOL wiring portion to form a metallic structure surrounding the through silicon via opening in the BEOL wiring portion.

13. The method of claim 11 wherein the semiconductor base portion has a first surface and the BEOL wiring portion has a second surface and the through silicon via continuously extends from the first surface to the second surface.

14. The method of claim 11 wherein the guard ring is spaced from the through silicon via.

15. A method of forming a semiconductor article comprising the steps of:
    (a) forming a semiconductor base portion comprising a semiconductor material;
    (b) forming a back end of the line (BEOL) wiring portion comprising a plurality of layers of metallic material and a dielectric material and excluding a semiconductor material;
    (c) forming an opening for a guard ring in the BEOL wiring portion;
    (d) filling the guard ring opening with a material;
    (e) forming a through silicon via opening through the BEOL wiring portion and the semiconductor base portion, the through silicon via opening through the BEOL wiring portion being contained wholly within the guard ring opening, the through silicon via opening through the semiconductor base portion being free of any guard ring; and
    (f) depositing metallization in the through silicon via opening to form a through silicon via.

16. The method of claim 15 wherein the guard ring material is a nonmetallic material.

17. The method of claim 15 wherein the guard ring material is a metallic material.

* * * * *